United States Patent [19]
Bennett et al.

[11] Patent Number: 5,508,519
[45] Date of Patent: Apr. 16, 1996

[54] MAINSHAFT SHIELD

[75] Inventors: Darryl A. Bennett; Christian K. Forgey, both of Dallas, Tex.

[73] Assignee: Texas Instruments Incorporated, Dallas, Tex.

[21] Appl. No.: 259,841

[22] Filed: Jun. 15, 1994

[51] Int. Cl.$^6$ .............................. H01J 37/317; G21F 1/00
[52] U.S. Cl. .................................... 250/492.21; 250/515.1
[58] Field of Search ............................ 250/492.21, 398, 250/515.1, 442.11

[56] References Cited

U.S. PATENT DOCUMENTS

| | | | |
|---|---|---|---|
| 3,783,405 | 1/1974 | Manoukian | 313/94.5 |
| 4,383,178 | 5/1983 | Shibata et al. | 250/442.11 |
| 4,448,799 | 5/1984 | Bergman et al. | 427/37 |
| 4,455,532 | 6/1984 | Gregory et al. | 250/305 |
| 4,670,126 | 6/1987 | Messer et al. | 204/298 |

*Primary Examiner*—Bruce C. Anderson
*Attorney, Agent, or Firm*—Mark E. Courtney; W. James Brady, III; Richard L. Donaldson

[57] ABSTRACT

A system for removal of contaminating particles from a target chamber (1) which includes a target chamber having an aperture in the floor thereof for entry of a reciprocating shaft (7) for positioning a wafer (11) within the target chamber, a seal (21) disposed at the aperture and about the shaft to seal the interior of the target chamber from the exterior of the target chamber at the seal and a removable shield mechanism (17), preferably of polytetrafluoroethylene, disposed within the target chamber, above the seal and around the shaft to retain particles scraped from the shaft. The shield mechanism has a pocket (29) disposed over the seal and around the shaft to retain the particles therein isolated from the target chamber. The shield mechanism comprises a shield (17) disposed around the shaft and a collar (18) contacting the shield and the floor of the target chamber to form the pocket with the seal. The collar further includes a lip (16) extending toward the shaft for supporting the shield thereon.

13 Claims, 2 Drawing Sheets

MAINSHAFT SHIELD

CROSS REFERENCE TO PENDING APPLICATION

This application is related to Ser. No. 08/259,809, filed Jun. 15, 1994 concurrently herewith for TARGET CHAMBER SHIELDING, the contents of which are incorporated herein by reference.

BACKGROUND OF THE INVENTION

1. Field of the Invention

This invention relates to shielding for ion implantation chambers to reduce particle contamination within the target chamber.

2. Brief Description of the Prior Art

A standard target chamber for implantation of ions into a semiconductor wafer generally includes an aperture in a side wall thereof for entry of the ion beam into the target chamber. Within the target chamber, a reciprocatable shaft, which is vertically reciprocatable, extends through the floor of the target chamber and supports and partially positions the wafer and other wafer securing and positioning mechanisms. The positioning mechanisms include a platen to which the wafer into which ions are to be implanted is secured. The platen is secured to a motorized apparatus which rotates the face of the platen holding the wafer up to ninety degrees from an upwardly facing direction to a direction facing the aperture through which the ion beam enters the target chamber. A wafer is loaded onto the platen while the wafer holding face of the platen is directed upwardly. After loading, the wafer is rotated to face the ion beam by operation of the motorized apparatus. The motorized apparatus is secured to a motor which rotates the motorized apparatus and platen at a 45 degree angle from the horizontal plane. The entire apparatus within the target chamber rests upon the shaft which is movable in a vertical direction to position the wafer in a vertical direction relative to the ion beam. The wafer can be rotated 360 degrees about its axis.

During ion implantation, the ionized material not only lands on the target, but some also condenses on the entire assembly within the target chamber including the chamber walls and the shaft. As the shaft moves downward in the course of its reciprocating movement, it rubs on a seal disposed in the bottom of the chamber and surrounding the shaft. This rubbing action causes the now non-ionic material condensed on the shaft, generally but not limited to arsenic, to be removed from the shaft and build up as particles, such as particles of arsenic, in the region of the seal on the floor of the target chamber. The build-up of particles of condensed material near the seal is a major cause of uncleanliness within the target chamber since the particles can ultimately land on wafers being processed within the chamber and add to the particle count on the wafer or cause other problems, thereby providing an ion implantation level other than that desired or in other ways reducing production yields. It is therefore readily apparent that yields will be improved by preventing the particles from landing on wafers being processed within the target chamber.

SUMMARY OF THE INVENTION

In accordance with the present invention, the above described problem of particle contamination is minimized and there is provided an improvement in the design of the target chamber in this regard.

Briefly, there is provided a shield which rests against the reciprocatable shaft and above the seal, the shield mechanism forming a pocket with the seal with an incline toward the shaft. The shield mechanism includes a mainshaft shield, preferably of polytetrafluoroethylene (Teflon), disposed over the seal and a collar, preferably stainless steel, having a lip to hold the shield thereon. The shield surrounds the shaft and the collar is secured to the interior floor of the chamber. The seal, shield and collar together form a pocket wherein particles that have condensed on the shaft and are later rubbed off of the shaft due to the reciprocating motion of the shaft against the seal, will land in the pocket and move inwardly along the top of the seal toward the interior of the pocket as opposed to movement into the atmosphere within the target chamber. The particles will accumulate in the pocket and have restricted or essentially no access to the chamber atmosphere due to the small spacing, if any, between the shield and the seal which form the pocket. The particles are removed from the pocket during periodic cleaning. However, such cleaning can now take place less often since the particles no longer present a problem with shutdown of the apparatus for cleaning thereby being delayed and the apparatus having a increased duty cycle. It follows that an advantage has been created in that both particle contamination is reduced and the apparatus is shut down for cleaning less often.

DESCRIPTION OF THE PREFERRED EMBODIMENT

Figure 1:
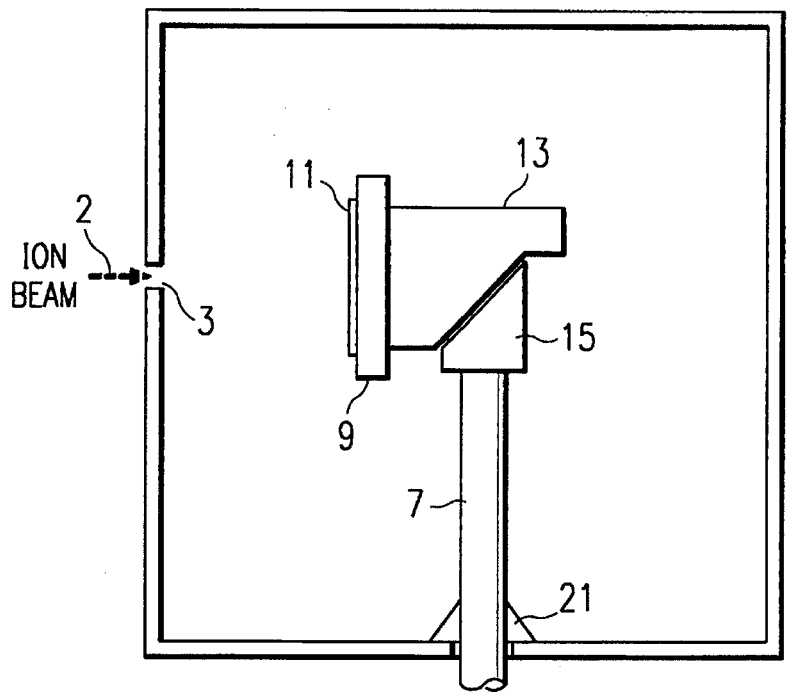
FIG. 1 is a schematic diagram of a prior art target chamber for implanting ions into semiconductor wafers.

Referring first to FIG. 1, there is shown a standard target chamber 1 for implantation of ions from an ion beam 2 into a semiconductor wafer 11. The target chamber 1 includes an aperture 3 in a side wall thereof for entry of the ion beam 2, such as, for example, arsenic ions, into the chamber. A reciprocatable shaft 7, which is vertically reciprocatable as shown by the arrow, extends through the floor of the target chamber 1 and supports and partially positions the wafer and other wafer securing and positioning mechanisms as will now be described.

Positioned within the target chamber 1 is a wafer 11 secured to a platen 9. Ions from the ion beam 2 are to be implanted into the wafer 11. The platen 9 is secured to a rotating mechanism or head assembly apparatus 13 which rotates the wafer 11 along a 360 degree path for positioning of the wafer relative to the ion beam 2. A motorized apparatus 15 rotates the rotating mechanism up to ninety degrees from an upwardly facing direction to a direction facing the aperture 3 so that the wafer 11 is properly positioned with respect to the aperture 3 and ion beam 2 for implant in the proper location in the wafer. In this way, a wafer 11 can be loaded onto the platen 9 while the wafer holding face of the platen is directed upwardly. Accordingly, motor 15 rotates the rotating apparatus 13 and platen 9 to the implant position facing toward the aperture 3 and the rotating apparatus 13 rotates the position of the wafer 11 in a 360 degree orientation. The entire apparatus within the target chamber 1 rests upon the shaft 7 which is movable in a vertical direction to position the wafer in a vertical direction relative to the ion beam. The door to the target chamber 1 is not shown.

During ion implantation, the ionized element not only lands on the target, but some of the ionized element also condenses on the entire assembly within the target chamber 1 including the chamber walls and the shaft 7. As the shaft 7 moves downward in the course of its reciprocating movement, it rubs on a seal 21 disposed in the bottom of the chamber and surrounding the shaft. This rubbing action causes the now non-ionic material condensed on the shaft 7, generally arsenic, to be removed from the shaft and build up as particles, such as particles of arsenic, at the seal 21 and within the target chamber 1. The build-up of particles of condensed material at the seal 21 is a major cause of uncleanliness within the target chamber 1 since the particles can ultimately land on wafers being processed within the chamber and add to the particle count in the wafer or cause other problems, thereby providing an ion implantation level other than that desired or in other ways reducing production yields.

Figure 2:
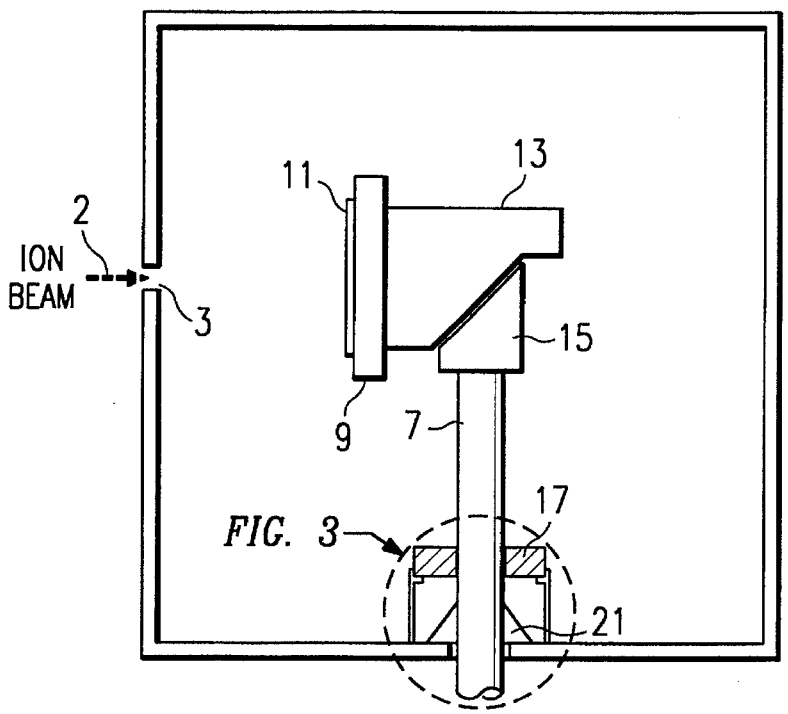
FIG. 2 is a schematic diagram of the target chamber of FIG. 1 with the shield in accordance with the present invention disposed within the target chamber.
Figure 3:
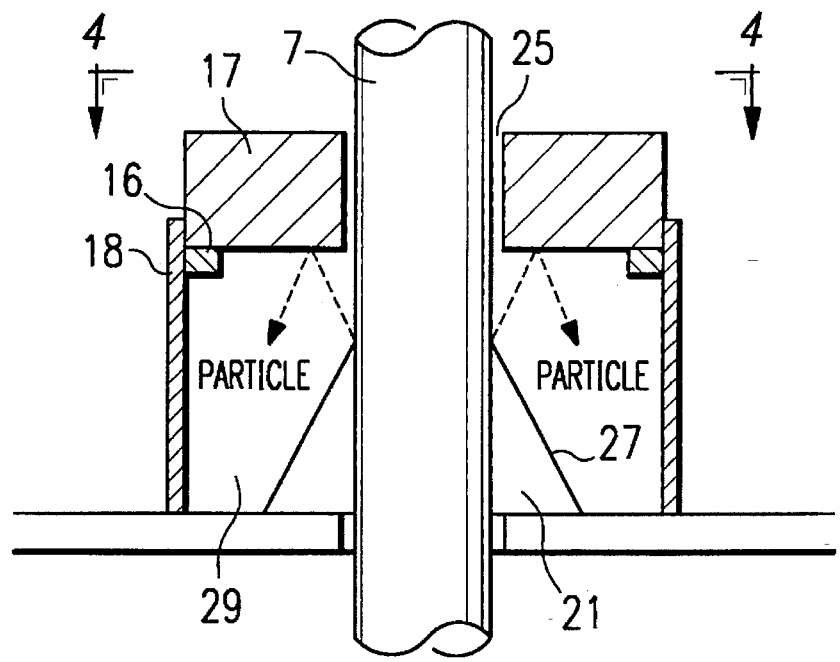
FIG. 3 is an enlarged view of the shield mechanism including shaft 7 with mainshaft seal 17, collar 18 and seal 21 to form the pocket 29.
Figure 4:
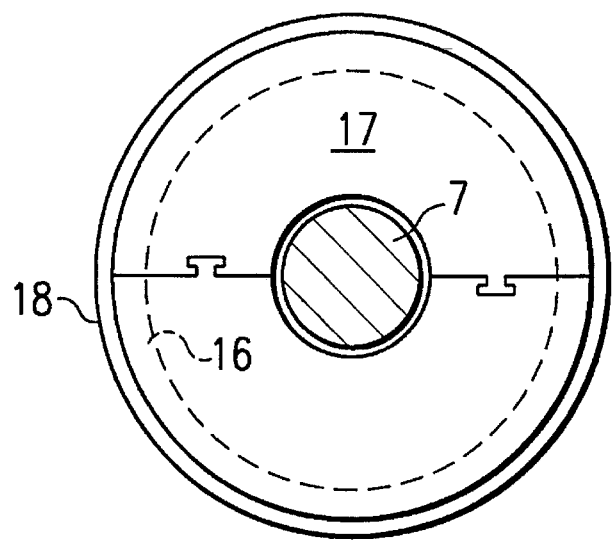
FIG. 4 is a view taken along the line 4—4 of FIG. 3.

Referring to FIG. 2 to 4, there is shown a mainshaft shield 17 for the shaft 7 in accordance with the present invention. The particles are trapped between the seal 27 and the shield 17. The shield 17 is disposed completely around the shaft 7 and immediately above the seal 21 but within the target chamber 1. The shield 17 rests on a lip 16 which is a flange extending toward the shaft 7 from a collar 18 which is secured to the floor of the chamber 1. The shield 17 has a flat bottom 23 with an aperture 25 therein to receive the shaft 7. The top portion 27 of the seal 21 extends upwardly and outwardly from the shaft 7 to form a small pocket 29 between the shield 17, the collar 18 and the seal 21. Accordingly, particles rubbing off of the shaft 7 and falling onto the seal 21 will travel down the top portion 27 and into the pocket 29 and be retained therein until later removed during a cleaning of the target chamber 1 by removal of the shield 17 and/or the collar 18. However, during fabrication operations within the chamber 1, any particles that have been scraped from the shaft 7 and fallen onto the seal 21 will be retained in the pocket 29 and not be available for contamination of a wafer then being processed.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A system for removal of contaminating particles from a target chamber comprising:

(a) a target chamber having an aperture in the floor of said target chamber for entry of a reciprocating shaft for positioning a wafer within said target chamber;

(b) a seal disposed at said aperture and about said shaft to seal the interior of said target chamber from the exterior of said target chamber at said seal; and (c) a removable shield mechanism disposed within said target chamber, above said seal and around said shaft to retain particles scraped from said shaft.

2. The system of claim 1 wherein said shield mechanism comprises a pocket disposed over said seal and around said shaft to retain said particles therein isolated from said target chamber.

3. The system of claim 2 wherein said shield mechanism comprises a shield disposed around said shaft and a collar contacting said shield and the floor of said target chamber to form said pocket with said seal.

4. The system of claim 3 wherein said shield consists essentially of polytetrafluoroethylene.

5. The system of claim 4 wherein said collar further includes a lip extending toward said shaft for supporting said shield thereon.

6. The system of claim 4 further including said shaft extending into said target chamber.

7. The system of claim 3 further including said shaft extending into said target chamber.

8. The system of claim 7 further including said shaft extending into said target chamber.

9. The system of claim 3 wherein said collar further includes a lip extending toward said shaft for supporting said shield thereon.

10. The system of claim 1 wherein said shield mechanism comprises a shield disposed around said shaft and a collar contacting said shield and the floor of said target chamber to form said pocket with said seal.

11. The system of claim 10 wherein said collar further includes a lip extending toward said shaft for supporting said shield thereon.

12. The system of claim 1 wherein said shield mechanism consists essentially of polytetrafluoroethylene, 13. The system of claim 1 further including said shaft extending into said target chamber.

* * * * *